US011445137B2

(12) United States Patent
Benjaram

(10) Patent No.: US 11,445,137 B2
(45) Date of Patent: Sep. 13, 2022

(54) SYSTEMS AND METHODS FOR REFERENCE SETTLING

(71) Applicant: SEMICONDUCTOR COMPONENTS INDUSTRIES, LLC, Phoenix, AZ (US)

(72) Inventor: Rajashekar Benjaram, Bangalore (IN)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 266 days.

(21) Appl. No.: 16/683,977

(22) Filed: Nov. 14, 2019

(65) Prior Publication Data

US 2021/0021781 A1 Jan. 21, 2021

(30) Foreign Application Priority Data

Jul. 17, 2019 (IN) .............................. 201911028735

(51) Int. Cl.
*H04N 5/3745* (2011.01)
*H04N 5/378* (2011.01)
*H03M 1/46* (2006.01)
*H03M 1/66* (2006.01)

(52) U.S. Cl.
CPC ........ *H04N 5/37455* (2013.01); *H03M 1/466* (2013.01); *H03M 1/66* (2013.01); *H04N 5/378* (2013.01)

(58) Field of Classification Search
CPC ... H04N 5/37455; H04N 5/378; H03M 1/466; H03M 1/66; H03M 1/68; H03M 1/804; H03M 1/468; H03M 1/0692
See application file for complete search history.

(56) References Cited

U.S. PATENT DOCUMENTS

| 6,094,155 A * | 7/2000 | Fees ..................... H03M 1/0863 327/401 |
| 6,958,722 B1 * | 10/2005 | Janakiraman ......... H03M 1/144 341/161 |
| 2010/0188278 A1 * | 7/2010 | Khanna ................. H03M 1/466 341/172 |

(Continued)

OTHER PUBLICATIONS

Funatsu et al., "113Mpixel 60fps CMOS Image Sensor with 32-Column Shared High-Speed Column-Parallel SAR ADCs" IEEE International Solid-State Circuits Conference, Feb. 23, 2015, pp. 112-114.

(Continued)

*Primary Examiner* — Lin Ye
*Assistant Examiner* — Tuan H Le
(74) *Attorney, Agent, or Firm* — Treyz Law Group, P.C.; Tianyi He

(57) ABSTRACT

An imaging system may include an image sensor. The image sensor may have an array of image pixels arranged in rows and columns. Each column of image pixels may be coupled to column readout circuitry via a corresponding column line. The column readout circuitry may include analog-to-digital conversion circuitry. The analog-to-digital conversion circuitry may include split MSB and LSB capacitor banks. The MSB capacitor bank may include capacitors selectively coupled to a coarse reference voltage or a fine reference voltage. The LSB capacitor bank may include capacitors electively coupled to the coarse reference voltage.

8 Claims, 5 Drawing Sheets

(56) References Cited

U.S. PATENT DOCUMENTS

| | | | |
|---|---|---|---|
| 2010/0231768 A1 | 9/2010 | Utsunomiya et al. | |
| 2012/0280841 A1* | 11/2012 | Wang | H03M 1/1295 |
| | | | 341/110 |
| 2013/0021181 A1* | 1/2013 | Shah | H03M 1/0692 |
| | | | 341/110 |
| 2015/0008308 A1* | 1/2015 | Huang | H03M 1/0863 |
| | | | 250/208.1 |
| 2019/0166325 A1 | 5/2019 | Kim | |
| 2019/0313042 A1* | 10/2019 | Janbu | H04N 5/3575 |
| 2020/0186155 A1* | 6/2020 | Gupta | H03L 7/18 |
| 2021/0306587 A1* | 9/2021 | Tomita | H03M 1/56 |

OTHER PUBLICATIONS

Tsai et al., "A Column-Parallel SA ADC with Linearity Calibration for CMOS Imagers" IEEE Sensors, 2012, pp. 1-4.

\* cited by examiner

SYSTEMS AND METHODS FOR REFERENCE SETTLING

This application claims the benefit of and claims priority to Indian Provisional Patent Application No. 201911028735, filed Jul. 17, 2019, which is hereby incorporated by reference herein in its entirety.

BACKGROUND

This relates generally to reference settling in circuitry and can be applicable to digital-to-analog converters implemented within analog-to-digital converters in image sensors.

Modern electronic devices such as cellular telephones, cameras, and computers often use image sensors. Image sensors may be formed from a two-dimensional array of image pixels. The array of image pixels is typically arranged in rows and columns. Each image pixel includes a photosensitive region that receives incident photons (i.e., light) and that converts the photons into electrical charge. Column readout circuitry is typically coupled to each column of image pixels for reading out image signals from the image pixels.

Conventional image sensors often include analog-to-digital converters for converting analog signals generated from the image pixels into digital signals. In image sensors with large arrays, most types of these analog-to-digital converters require reference settling in a capacitive digital-to-analog converter for every bit iteration of a full conversion cycle. A typical reference buffer providing a reference voltage for reference settling can cause slow reference settling, thereby undesirably limiting conversion time and bandwidth.

It may be therefore desirable to provide a reference buffer to support a high slew rate and to support high bandwidth with varying capacitive loads and to provide circuitry with other desirable characteristics. It is within this context that the embodiments herein arise.

DETAILED DESCRIPTION

Embodiments of the present invention relate to reference settling in circuitry, and more particularly to signal conversion circuitry within imaging systems (e.g., a DAC in an ADC for an image sensor). If desired, the signal conversion circuitry may be implemented in any suitable system. It will be recognized by one skilled in the art, that the present exemplary embodiments may be practiced without some or all of these specific details. In other instances, well-known circuits and operations have not been described in detail in order not to unnecessarily obscure the present embodiments.

To provide a high slew rate and support high bandwidth with varying capacitive loads, reference signal generation circuitry may provide a coarse reference voltage signal (e.g., a coarse reference) and a fine reference voltage signal (e.g., a fine reference). The slew (e.g., the high slew rate) may be provided using the coarse reference voltage signal in an MSB (most significant bit(s)) bank of a split SAR (successive approximation register) DAC. The same coarse reference voltage signal may be used as a reference for an LSB (least significant bit(s)) bank of the split SAR DAC, since reference accuracy requirements of the LSB bank can be relaxed to m (i.e., number of least significant bits)+1 bit accuracy. Furthermore, the fine reference voltage signal (and the coarse reference voltage signal) may be provided to the MSB bank of the split SAR DAC. The fine reference voltage signal may provide the fine-tuned final setting after the slew using the coarse reference voltage signal. The SAR DAC may be provided in an ADC, as an example. These illustrative features of the invention are described in further detail herein.

Figure 1:
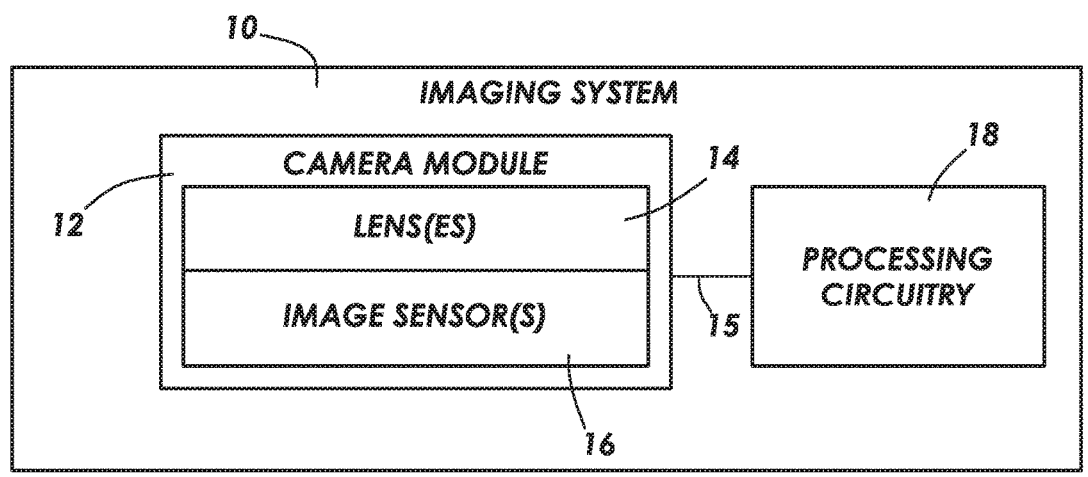
FIG. 1 is a diagram of an illustrative electronic device in accordance with some embodiments.

FIG. 1 is a diagram of an illustrative electronic device in accordance with an embodiment of the present invention. As shown in FIG. 1, imaging system 10 may be a portable imaging system such as a camera, automotive imaging system, cellular telephone, video camera, video surveillance system, or any other desired imaging device that captures digital image data. System 10 may include a camera module 12 that is used to convert incoming light into digital image data. Camera module 12 may include one or more lenses 14 and/or one or more image sensors 16. Lens(es) 14 and image sensor(s) 16 may be mounted in a common package and may provide image data to processing circuitry 18. One or more lenses 14 may be arranged as a lens array 14 and/or one or more image sensors 16 may be arranged as an image sensor array 16, as an example.

Processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes one or more image sensors 16 or an integrated circuit within module 12 that is associated with one or more image sensors 16). Image data that has been captured and processed by camera module 12 may, if desired, be further processed and stored using processing circuitry 18. Processed image data may, if desired, be provided to external equipment (e.g., a computer or other device) using wired and/or wireless communications paths coupled to processing circuitry 18.

Image sensor(s) 16 may include image pixels. Each image pixel in image sensor(s) 16 may receive light of a given color by providing the corresponding image pixel with a color filter. The color filters that are used for image pixels in image sensor(s) 16 may, for example, be red filters, blue filters, and green filters. Other filters such as white color filters, dual-band IR cutoff filters (e.g., filters that allow visible light and a range of infrared light emitted by LED lights), or any suitable filters may also be used.

Figure 2:
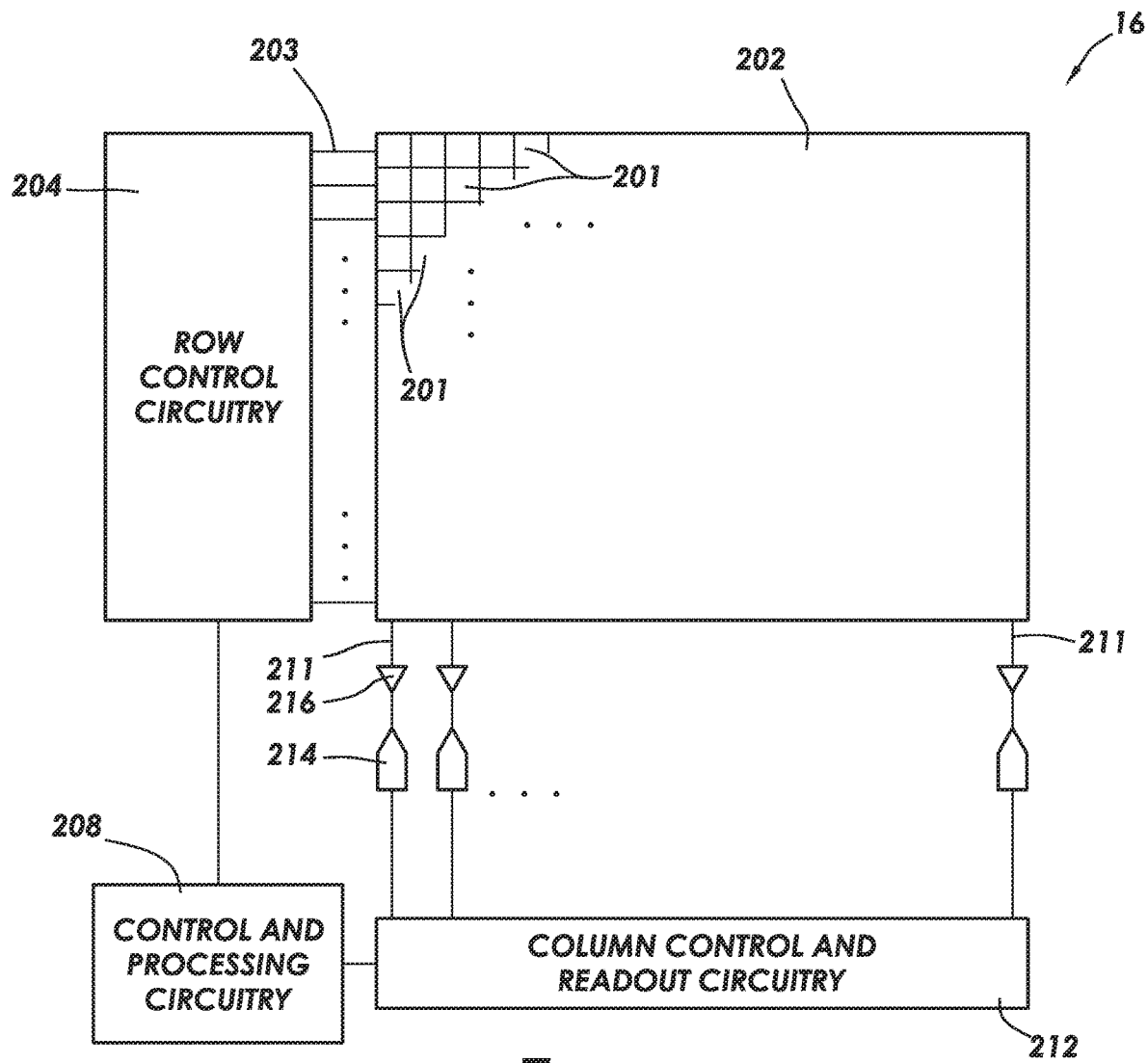
FIG. 2 is a diagram of an illustrative image pixel array in an image sensor in accordance with some embodiments.

FIG. 2 is a diagram of an illustrative image pixel array in an image sensor (e.g., image sensor 16 in FIG. 1). As shown in FIG. 2, image sensor 16 may include image pixel array 202 having multiple pixels 201 (sometimes referred to herein as image pixels 201 or image sensor pixels 201). Row control circuitry 204 may be coupled to image pixel array 202. Row control circuitry 204 may provide pixel control signals (e.g., row select signals, pixel reset signals, charge transfer signals, etc.) to pixels 201 over corresponding row control lines 203 to control the capture and readout of images using pixels 201 in image pixel array 202.

Image sensor 16 may include column control and readout circuitry 212 (sometimes referred to herein as column readout circuity 212, readout circuitry 212, column circuitry 212, or column control circuitry 212) and may include control and processing circuitry 208 (sometimes referred to herein as control circuitry 208) that is coupled to row control circuitry 204 and column readout circuitry 212. Column readout circuitry 212 may be coupled to image pixel array 202 via multiple column lines 211 (sometimes referred to herein as output lines 211 or pixel output lines 211). For example, each column of pixels 201 in image pixel array 202 may be coupled to a respective column line 211. A corresponding analog-to-digital converter (ADC) 214 (sometimes referred to herein as analog-to-digital conversion circuitry 214, ADC circuitry 214, or conversion circuitry 214) and (column) amplifier circuitry 216 may be coupled to (e.g., interposed on) each column line 211 for amplifying analog image signals captured by image pixel array 202 and converting the captured analog image signals (e.g., analog pixel signals) to corresponding digital image data (e.g., digital pixel data). Column control and readout circuitry 212 may be coupled to external hardware such as processing circuitry (e.g., processing circuitry 208 external to column circuitry 212, processing circuitry 18 in FIG. 1 external to image sensor 16). Column control and readout circuitry 212 may perform column readout operations based on (analog) signals and/or (digital) data received from control and processing circuitry 208, as an example. In some examples, column control and readout circuitry 212 may be described herein to include column ADC circuits 214 and column amplifiers 216.

One or more amplifiers 216 may be configured to receive analog image signals (e.g., analog reset level signals and/or image level signals) from image pixel array 202 and to amplify the analog image signals. The analog image signals may include data from a single column of pixels 201 or from multiple columns of pixels 201, depending on the application and the configuration of image sensor 16. Conversion circuitry 214 may receive amplified analog image signals from amplifier circuitry 216 and may perform analog-to-digital conversion operations on the analog image signals to generate digital image data. The digital image data may be transmitted to (other portions of) column control and readout circuitry 212 for processing operations and/or readout operations.

Figure 3:
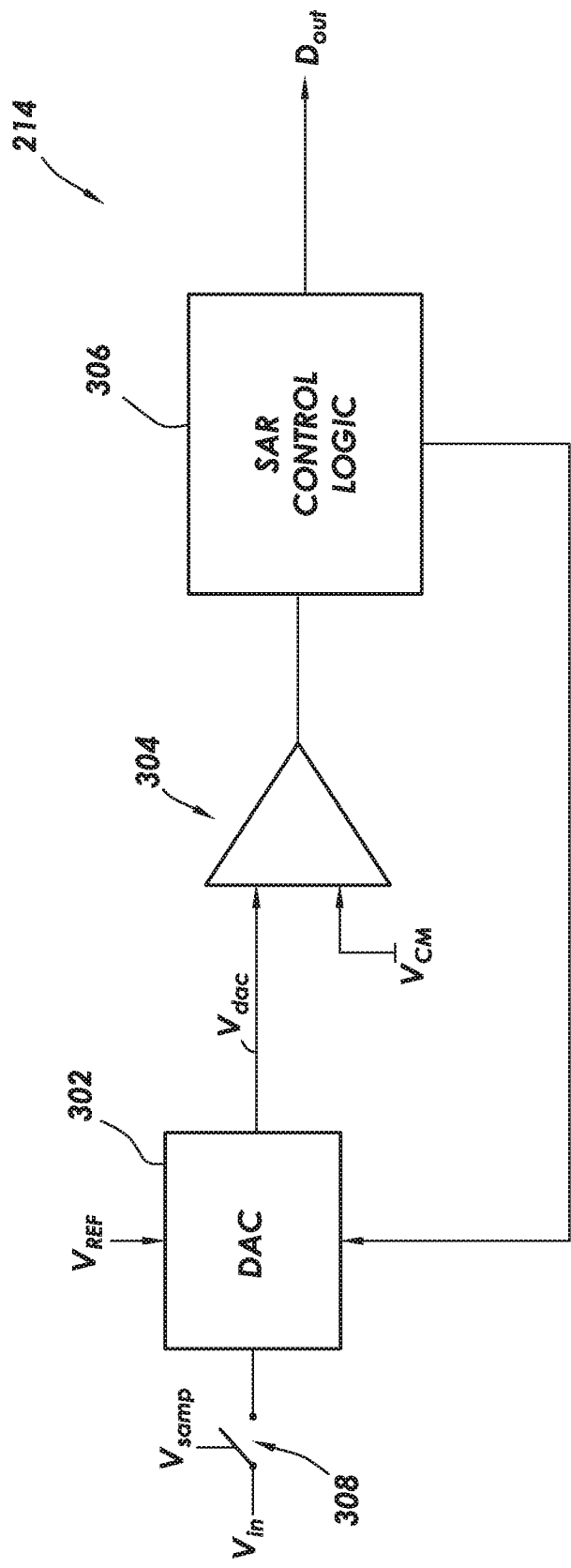
FIG. 3 is a diagram of an illustrative analog-to-digital converter (ADC) in accordance with some embodiments.

FIG. 3 is a schematic diagram of an illustrative analog-to-digital conversion circuitry (e.g., an analog-to-digital converter, ADC) configured to convert analog input signal Vin into digital output data Dout. As an example, an analog-to-digital converter (ADC) that may be included in an image sensor (e.g., ADC 214 in image sensor 16 of FIG. 2). While described herein in the context of an image sensor and/or imaging system, ADC 214 in FIG. 3 may be implemented in any other suitable device or system. In the illustrative example of an imaging system, ADC 214 may receive analog signals from image pixel array 202. ADC 214 may receive the analog image signals as an input analog signal Vin. Input signal Vin may be one or more analog signals from (e.g., generated by) one or more pixels 201 in image pixel array 202 (e.g., signals received over one or more column lines 211). ADC 214 may convert input analog image signal Vin to digital image data Dout, which may be provided to downstream readout and/or processing circuitry.

In the example of FIG. 3, ADC 214 may be a successive approximation register (SAR) ADC. A successive approximation register ADC may use a binary search algorithm that is implemented using a digital-to-analog converter (DAC) 302, comparator 304, and successive approximation register (SAR) control logic 306.

DAC 302 (sometimes referred to herein as conversion circuitry 302) may serve as (e.g., may include) a sampling and holding circuit for input signal Vin (using switch 308). In other words, DAC 302 may receive signal Vin and may output signal Vdac (sometimes referred to herein as voltage Vdac) generated based on the sampled input signal Vin. To generate analog signal Vdac based on input voltage Vin, DAC may use one or more reference voltages VREF (sometimes referred to herein as one or more reference voltage signals VREF) and one or more control signals from SAR control logic circuitry 306. Analog signal Vdac may be compared to a reference voltage VCM such as a reference ground voltage using comparator 304 (sometimes referred to herein as comparison circuitry 304). The voltage output by DAC 302 (e.g., signal Vdac) may be varied, thereby allowing successive comparisons to reference voltage VCM. Each comparison may further narrow the range of possible values of Vin, with the number of comparisons determining the resolution of the conversion.

Comparator 304 may receive voltage (signal) Vdac at a first input and voltage (signal) VCM at a second input. The comparator may compare the magnitude of voltage Vdac to the magnitude of voltage VCM. The output of comparator 304 may be a signal that is provided to SAR control logic 306 (sometimes referred to herein as register 306). The output signal of comparator 304 may have a value indicative of which signal has a higher voltage (e.g., the comparator output may be asserted at a logic high level "1" if voltage signal Vdac is greater than voltage signal VCM, whereas the comparator output may be driven to a logic low level "0" if voltage signal Vdac is greater than voltage signal VCM, or vice versa).

SAR control logic 306 in FIG. 3 may sometimes be referred to as processing circuitry. Processing circuitry 306 may track the results of comparisons by comparator 304 and adjust the output of DAC 302 accordingly (using the control path coupling SAR control logic 306 to DAC 302). Processing circuitry 306 may also output the result of the analog-to-digital conversion (e.g., digital data Dout, which is a digital representation of analog signal Vin).

The configuration of ADC 214 in FIG. 3 is merely illustrative. If desired, ADC 214 may have any other suitable configuration. If desired, the output of DAC 203 may be provided to a first input of comparator 304 and signal Vin may be provided to a second input of comparator 304. If desired, voltage VCM may be implemented as a non-grounding voltage. If desired, DAC 302, comparator 304, and/or register 306 may be implemented (e.g., coupled to each other) in any suitable configuration to perform analog-to-digital conversion operations.

If desired, DAC 302 may be any desired type of digital-to-analog converter. In one illustrative example, DAC 302 may be a capacitive DAC such as a split capacitor DAC having an n-bit MSB (capacitor) bank and an m-bit LSB (capacitor) bank. In general, SAR ADCs with split capacitor DACs have a single reference voltage (e.g., a single high reference voltage relative to a low reference voltage, a single reference voltage above a ground voltage). However, when implemented in large format arrays, the reference voltage may be required to drive loads on the order of nF (nanofarads) within the capacitive DAC, which is undesirable.

Additionally, this leads to longer reference settling time in the capacitive DAC and will therefore limit conversion time in the ADC.

Figure 4:
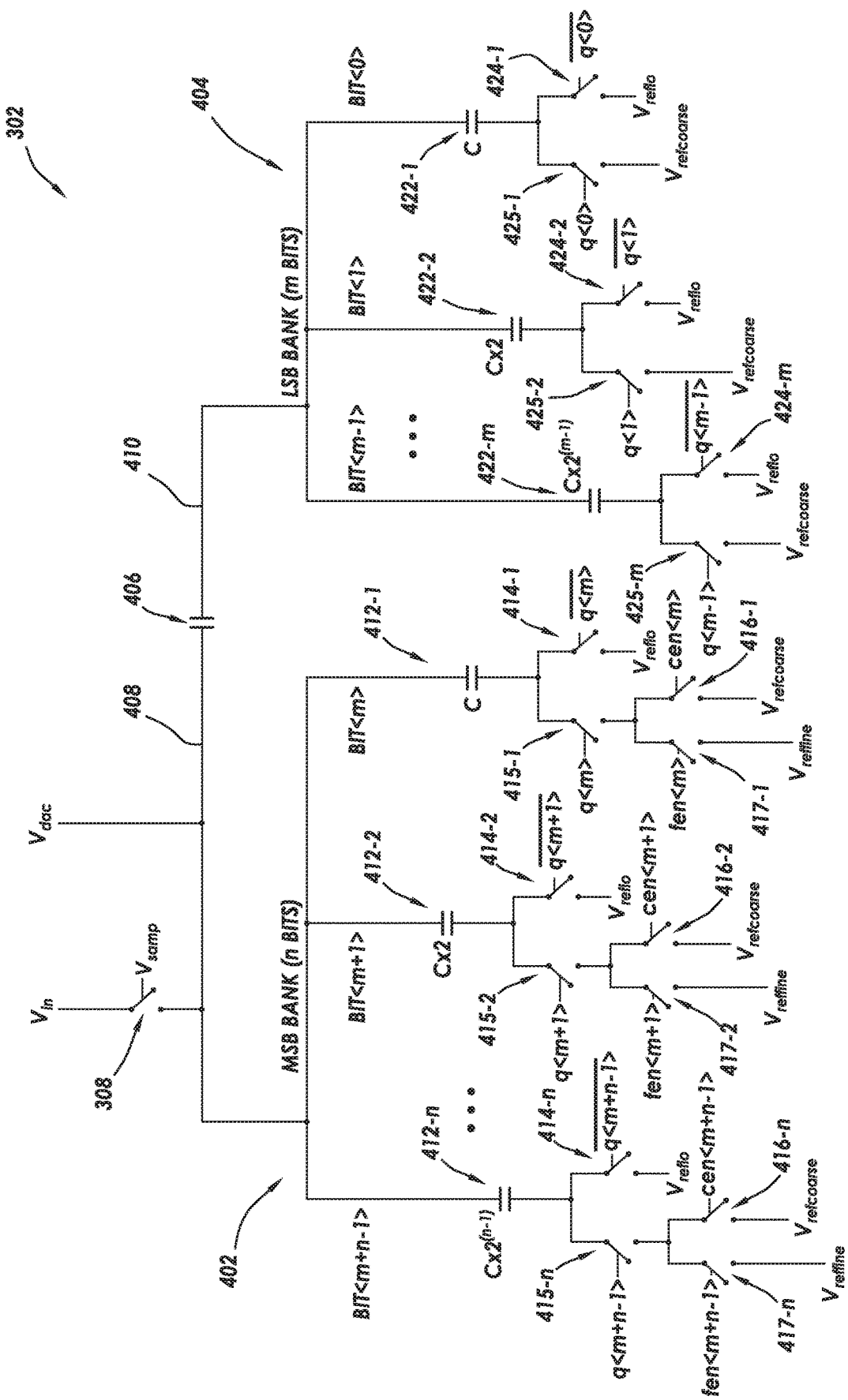
FIG. 4 is a diagram of an illustrative digital-to-analog converter (DAC) in accordance with some embodiments.

FIG. 4 shows an illustrative DAC that overcomes the above-mentioned issues (e.g., a capacitive DAC that receives two reference voltages (e.g., two reference voltage signals above a ground voltage). As an illustrative example, DAC 302 in FIG. 4 may be implemented within ADC 214 in FIGS. 2 and/or 3. While described herein in the context of an imaging sensor or system and analog-to-digital conversion circuitry, DAC 302 in FIG. 4 may be implemented in any other suitable circuitry, device, and/or system.

As shown in FIG. 4, DAC 302 may include MSB (capacitor) bank 402 and LSB (capacitor) bank 404 coupled by an interposing capacitor 406 (sometimes referred to as split capacitor 406). Capacitor 406 may have a first terminal coupled to path 408, to which MSB bank 402 is coupled. Capacitor 406 may have a second terminal coupled to path 410, to which LSB bank 404 is coupled. Input signal Vin may be provided to path 408 via sampling switch 308. Control signal Vsamp may be used to control switch 308. DAC output signal Vdac may be coupled to path 408.

MSB bank 402 may include a suitable number of capacitors 412-1 to 412-$n$ coupled in parallel to path 408. For reference, capacitors 412 are labeled with 1, 2, ..., n. If desired, the actual number of capacitors may be n+1 or any other suitable number, as examples. Capacitors 412 may include capacitors having different capacitance values. As an example, MSB bank 402 may include capacitors 412, respectively having capacitances C, $C*2^1$, ..., $C*2^{(n-1)}$. If desired, MSB bank 402 may have any other set of capacitance values for capacitors 412. The number of capacitors 412 may be indicative of a number of bits associated with MSB bank 402 (e.g., a conversion resolution for the most significant bits). Each of these capacitors 412 may have a first terminal (e.g., a top plate in FIG. 4) coupled to line 408. Each of these capacitors 412 may have a second terminal (e.g., a bottom plate in FIG. 4) coupled to multiple reference voltages (e.g., one or more voltage sources supplying the multiple reference voltages) via switches.

In particular, a corresponding switch 414 may couple the second terminal of a corresponding capacitor 412 to reference voltage Vreflo. A corresponding switch 415 and a corresponding switch 416 may couple the second terminal of a corresponding capacitor 412 to reference voltage Vrefcoarse. A corresponding switch 415 and a corresponding switch 417 may couple the second terminal of a corresponding capacitor 412 to reference voltage Vreffine.

SAR control logic 306 and/or any other control circuitry may provide control signals to each set of switches 414, 415, 416, and 417. As an example, control logic 306 (which may include a set of latches) may provide control bits (latch bits) to control one or more of switches 414 and 415 in MSB bank 402. The control signal (bit) provided to switch 414 may be an inverse (e.g., an inverted version) of the control signals to switch 415. Additionally, control circuitry (e.g., control logic 306) may selectively activate switches 416 and 417 to electrically connect one of voltages Vrefcoarse and Vreffine to switch 415 to perform faster settling while also reducing power consumption and to accurately settle to a precise voltage.

As an example, control circuitry may provide control signal bits q<m>, q<m+1>, ..., q<m+n−1> to respective switches 415 as shown in FIG. 4. Control circuitry may provide inverted versions of control signal bits q<m>, q<m+1>, ..., q<m+n−1> (e.g., bits q<m>, q<m+1>, ..., q<m+n−1> with overline in FIG. 4) to respective switches 414 as shown in FIG. 4. Control circuitry may also provide control signal bits cen<m>, cen<m+1>, ..., cen<m+n−1> to respective switches 416 as shown in FIG. 4 and control signal bits fen<m>, fen<m+1>, ..., fen<m+n−1> to respective switches 417 as shown in FIG. 4. As an example, each bit of control signals q, cen, and fen may be provided along parallel bit lines. By provide these control bits, control circuitry may control MSB bank 402 to couple (e.g., electrically connect) the respective bottom plate of any capacitor 412 to one of three voltages (e.g., voltages Vreflo, Vrefcoarse, and Vreffine).

LSB bank 404 may include a suitable number of capacitors 422-1 to 422-$m$ coupled in parallel to path 410. For reference, capacitors 422 are labeled with 1, 2, ..., m. If desired, the actual number of capacitors may be m+1 or any other suitable number, as examples. Capacitors 422 may include capacitors having different capacitance values. As an example, LSB bank 404 may include capacitors 422, respectively having capacitances C, $C*2^1$ ..., $C*2^m$. If desired, LSB bank 404 may have any other set of capacitance values for capacitors 422. In some configurations, capacitance C for capacitor 412-1 in MSB bank 402 may be different from capacitance C for capacitor 422-1 in LSB bank 404. The number of capacitors 422 may be indicative of a number of bits associated with LSB bank 404 (e.g., a conversion resolution for the least significant bits). Each of these capacitors 422 may have a first terminal (e.g., a top plate in FIG. 4) coupled to line 410. Each of these capacitors 422 may have a second terminal (e.g., a bottom plate in FIG. 4) coupled to multiple reference voltages (e.g., one or more voltage sources supplying the multiple reference voltages) via switches.

In particular, a corresponding switch 424 may couple the second terminal of a corresponding capacitor 422 to reference voltage Vreflo. A corresponding switch 425 may couple the second terminal of a corresponding capacitor 422 to reference voltage Vrefcoarse.

SAR control logic 306 and/or any other control circuitry may provide control signals to each set of switches 424 and 425. As an example, control logic 306 (which may include a set of latches) may provide control bits (latch bits) to control one or more of switches 424 and 425 in LSB bank 404. The control signal (bit) provided to switch 424 may be an inverted version of the control signal (bit) to switch 425. Additionally, control circuitry (e.g., control logic 306) may selectively activate switches 425 to electrically connect voltage Vrefcoarse to switch 415 to utilize at least one of the same reference voltages as in MSB bank 402, thereby simplifying the design effectively without adversely affecting the voltage settling in LSB bank 404.

As an example, control circuitry may provide control signal bits q<0>, q<1>, ..., q<m−1> to respective switches 425 as shown in FIG. 4. Control circuitry may provide inverted versions of control signal bits q<0>, q<1>, ..., q<m−1> (e.g., bits q<0>, q<1>, ..., q<m−1> with overline in FIG. 4) to respective switches 424 as shown in FIG. 4. As an example, bits q<0>, q<1>, ..., q<m−1> of control signal q may be provided along parallel bit lines. By provide these control bits, control circuitry may control LSB bank 404 to couple (e.g., electrically connect) the respective bottom plate of any capacitor 412 to one of two voltages (e.g., voltages Vreflo and Vrefcoarse).

In some configurations, voltage Vreflo may be a ground voltage (e.g., 0V). Voltages Vrefcoarse and Vreffine may be a non-ground voltage (e.g., a positive voltage higher or larger than voltage Vreflo). While FIG. 3 shows reference voltage signal VREF provided to DAC 302, reference voltage signal VREF may represent multiple reference voltage signals in accordance with some embodiments. In particular, DAC 302 may receive two reference voltage signals Vrefcoarse and Vreffine, and a ground reference voltage (signal) such as voltage Vreflo.

Figure 5:
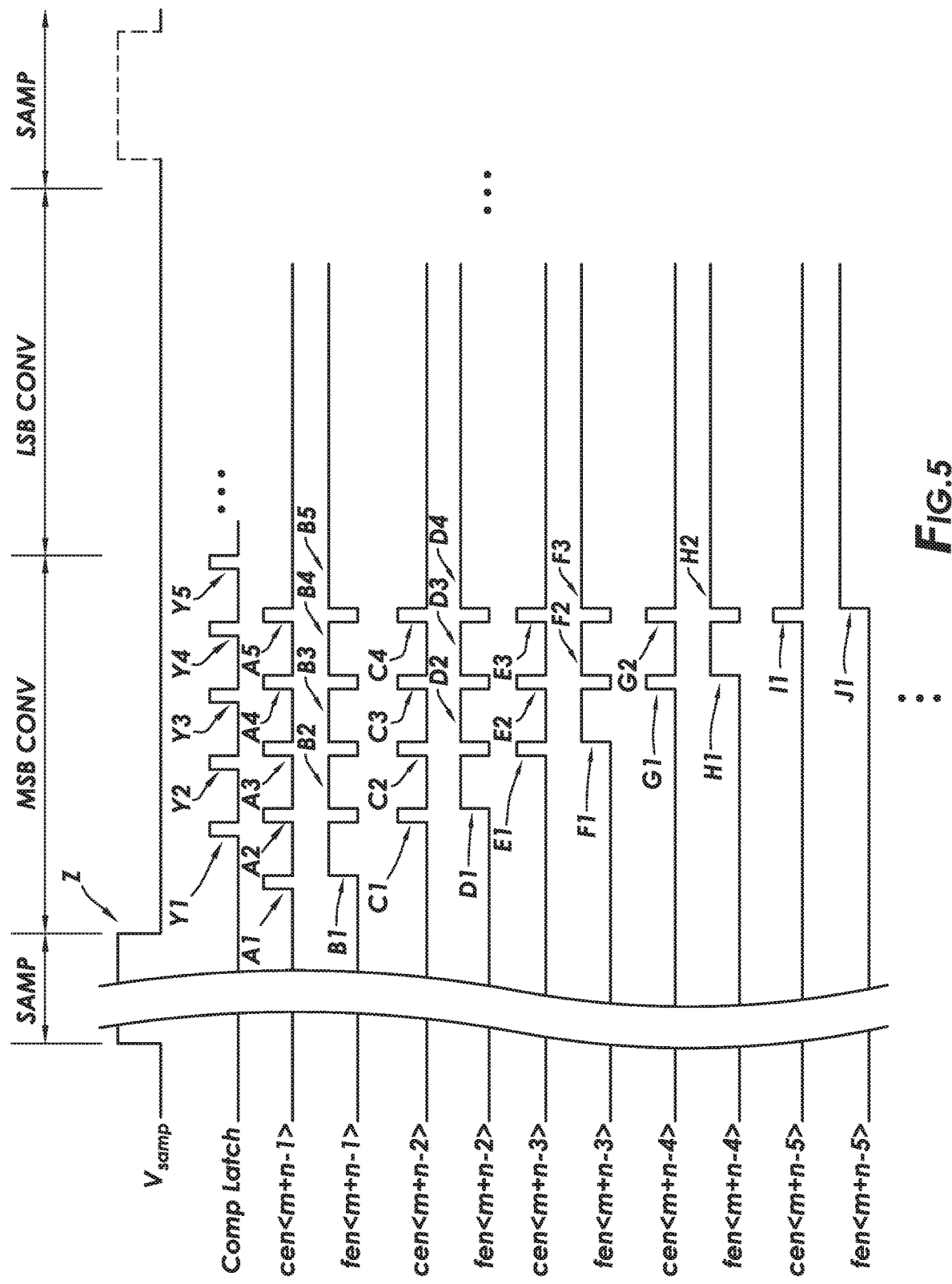
FIG. 5 is an illustrative timing diagram for operating signal conversion circuitry in accordance with some embodiments.

FIG. 5 shows an illustrative timing diagram of how an exemplary DAC and/or ADC circuit (such as those shown in FIGS. 3 and 4) may be operated. In particular, each conversion cycle may include a sampling time period SAMP, an MSB conversion time period MSB CONV, and an LSB conversion period LSB CONV. During time period SAMP, switch control signal Vsamp such as the control signal for switch 308 in FIGS. 3 and 4 may be asserted (at assertion Z) to activate or closed switch 308 to sample the input (image) signal.

Thereafter, during period MSB CONV, different sets of switches may be activated or closed to perform conversion operations for the most significant bits. AS shown in FIG. 5, during MSB conversion operations, a combination of control bits (e.g., at bits <m>, <m+1>, . . . , <m+n−4>, <m+n−4>, <m+n−3>, <m+n−2>, and <m+n−1>) for control signals cen and fen may be asserted to activate or close respective switches 416 and 417 in FIG. 4. In other words, each bit of signals cen and fen may correspond to a coupling to a capacitor associated with that bit.

While not explicitly shown in FIG. 5, during MSB conversion operations, control circuitry may also assert a combination of control bits (e.g., at bits <m>, <m+1>, . . . , <m+n−4>, <m+n−4>, <m+n−3>, <m+n−2>, and <m+n−1>) for control signal q associated with capacitors 414 and 415. As an example, a given bit (e.g., bit <m+n−1>) for control signal q may be asserted when a capacitor associated with the given bit (e.g., capacitor 412-$n$ in FIG. 4) is used in the MSB conversion operations such as when either the given bit (e.g., bit <m+n−1>) for control signal fen or for control signal cen is asserted. This may provide the proper connection from the second terminal (e.g., the bottom plate) of a corresponding capacitor 412 to one of voltages Vreffine and Vrefcoarse. As another example, when a capacitor (e.g., capacitor 412-1 in FIG. 4) associated with a given bit (e.g., bit <m>) is not used in the MSB conversion operations such as when neither the given bit (e.g., bit <m>) for control signal fen nor for control signal cen are asserted, the given bit (e.g., bit <m>) for control signal q may be deasserted.

For each of the comparator cycles during the MSB conversion operations (e.g., as indicated by the assertion of signal compLatch for comparator 304 in FIG. 3), the coarse reference voltage (e.g., voltage Vrefcoarse) may be first used and subsequently the fine reference voltage (e.g. voltage Vreffine) may be used. This can support a high slew rate, high bandwidth, thereby improving conversion time.

As an example, in the MSB(n)$^{th}$ bit conversion, a reference driver may supply a charge approximately equal to $Y*(C*2^n/2+C_{pn})*$Vreffine, where Y is the number of column parallel ADCs, C is unit capacitance of DAC 302 and $C_{pn}$ is the bottom plate parasitic of n$^{th}$ bit capacitor (e.g., capacitor 412-$n$). The effective capacitance seen at the MSB bank bottom plate may be approximately $C_{eq}=Y*(C*2^n/2+C_{pn})$.

Charging to $C_{eq}*$Vreffine may cause the reference driver to slew to the voltage Vreffine*$C_{vrefdrv}$/($C_{vrefdrv}$+Ceq), where $C_{vrefdrv}$ is the output and routing capacitance of the reference driver. To reduce the slewing on the reference driver to 50%, $C_{vrefdrv}$ may be required to be Ceq/2. The slew current required may be order of few 100 mA for few clock cycles. This large slew current may cause very high power dissipation in the reference driver. The slew requirement may be solved by charging the DAC capacitor bottom plate(s) to voltage Vrefcoarse for one, two, or any other suitable number of clock cycles and then to voltage Vreffine.

For the MSB (n−1)$^{th}$ bit conversion, if MSB (n)$^{th}$ bit is connected to Vreffine (for Vin>Vreffine/2), the fine reference driver may have to supply the charge approximately equal to $C*2^n*$Vrefcoarse/8+$C_{pn}*$Vrefcoarse/8, where C is unit capacitance of the DAC and $C_{pn}$ is the bottom plate parasitic of n$^{th}$ bit. The effective voltage change seen due to the change in signal Vdac by Vrefcoarse/4 at MSB bottom plate bit<n+m−1> is Vrefcoarse/8. This additional charge may introduce slewing into the fine reference driver.

To avoid the slewing on fine reference driver during the MSB (n−1)$^{th}$ bit conversion, the MSB (n−1)$^{th}$ bit capacitor (e.g., capacitor 412-($n$−1)) may be connected to voltage Vrefcoarse during the MSB (n−1)$^{th}$ bit charging to voltage Vrefcoarse. One, two or any suitable number of clock cycles may be used for charging to voltage Vrefcoarse depending on the design routing RC (resistor-capacitor circuit). After charging the bottom plates to voltage Vrefcoarse, control circuitry may switch to fine reference voltage Vreffine for deciding the bit value accurately.

To avoid the slew on the fine reference buffer, for each bit conversion all the bits may be switched to voltage Vrefcoarse for one, two, or any suitable number of clock cycles. Thereafter, all the bits may be switched back to voltage Vreffine.

In the example of FIG. 5, during the most significant bit conversion (e.g., MSB bank n$^{th}$ bit or bit<m+n−1> conversion), at assertion A1, control circuitry may assert control signal bit cen<m+n−1> (and control signal bit q<m+n−1>) to connect the bottom plate of capacitor 412-$n$ in FIG. 4 to voltage Vrefcoarse. This may provide the high slew rate for reference settling (e.g., for changing output signal Vdac in FIGS. 3 and 4). After a suitable amount of time, at assertion B1, control circuitry may assert control signal bit fen<m+n−1> (and control signal bit q<m+n−1>) to connect the bottom plate of capacitor 412-$n$ in FIG. 4 to voltage Vreffine. This may provide the accuracy for reference settling (e.g., for changing output signal Vdac in FIGS. 3 and 4). While the bottom plate of capacitor 412-$n$ is connected to voltage Vreffine, output signal Vdac may flip the output of comparator 304, thereby resulting in assertion Y1. This may complete a single bit conversion.

During the subsequent bit conversion (e.g., MSB bank (n−1)$^{th}$ bit or bit<m+n−2> conversion), at assertions A2 and C1, control circuitry may assert control signal bits cen<m+n−1> and cen<m+n−2> (and control signal bits q<m+n−1> and q<m+n−2>) to connect the bottom plates of capacitor 412-$n$ in FIG. 4 and capacitor 412-($n$−1) (e.g., the capacitor associated with the second most significant bit) to voltage Vrefcoarse. After a suitable amount of time, at assertions B2 and D1, control circuitry may assert control signal bits fen<m+n−1> and fen<m+n−2> (and control signal bits q<m+n−1> and q<m+n−2>) to connect the bottom plates of capacitors 412-$n$ and 412-($n$−1) to voltage Vreffine. While the bottom plates of capacitors 412-$n$ and 412-($n$−1) are connected to voltage Vreffine, output signal Vdac may flip the output of comparator 304, thereby resulting in assertion Y2. This may complete another bit conversion.

Similar operations may take place for a combination of capacitors in MSB bank 402 in FIG. 4. In the example of FIG. 5, MSB conversion may begin with the most significant bit of the control signals (e.g., bit<m+n−1> for control signals q, cen, and fen) and may proceed to less significant bits in MSB bank 402.

Following the least significant bit conversion in MSB bank 402 (e.g., associate with assertion Y5 in FIG. 5 for illustration), the LSB conversion time period may begin. During LSB conversion, the coarse reference voltage but not the fine reference voltage may be used, as the accuracy requirements for the reference voltage are less stringent. In particular, the accuracy can be relaxed up to m (number of least significant bits)+1 bit. Using by closing switches such as switches 425 in FIG. 4, the bottom plates of capacitors 422 in LSB bank 404 may be charged. Combinations of capacitors 422-m (beginning with the capacitor associated with the most significant bit) may be used in the LSB bit conversions. After performing LSB conversion, the full conversion cycle may be completed and a subsequently signal may be sampled during a subsequent sampling period.

Figure 6A:
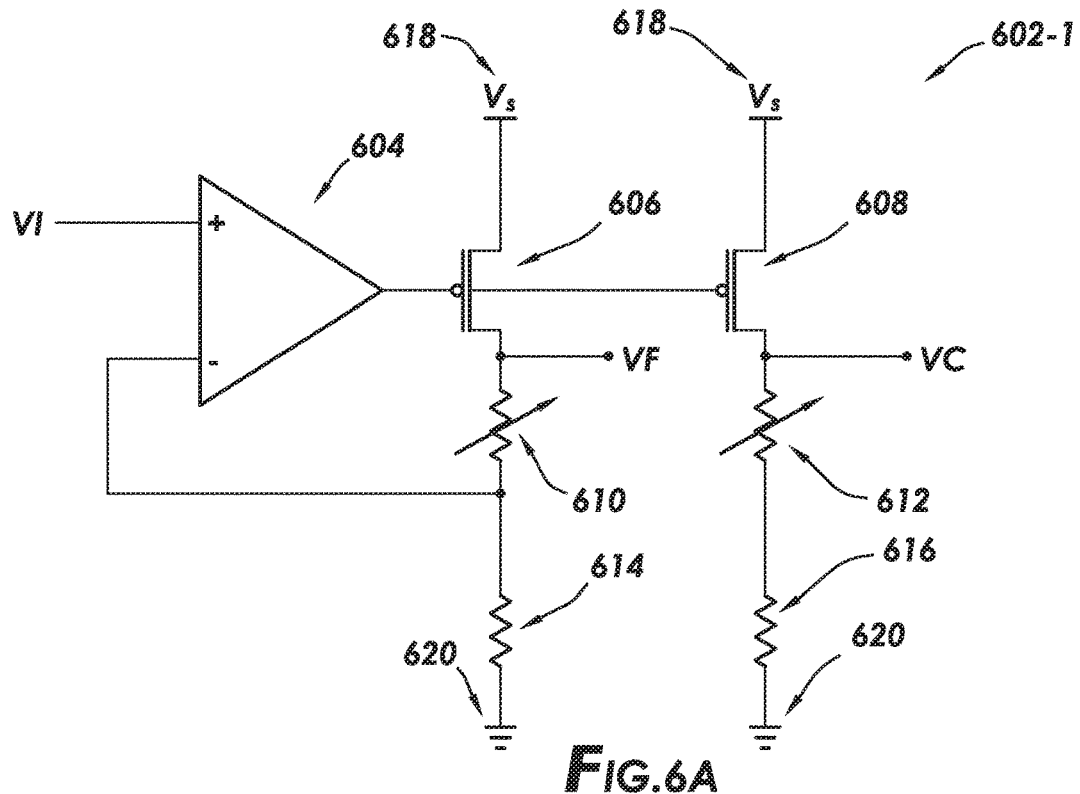
FIGS. 6A-6C are diagrams of illustrative reference signal generation circuitry in accordance with some embodiments.
Figure 6B:
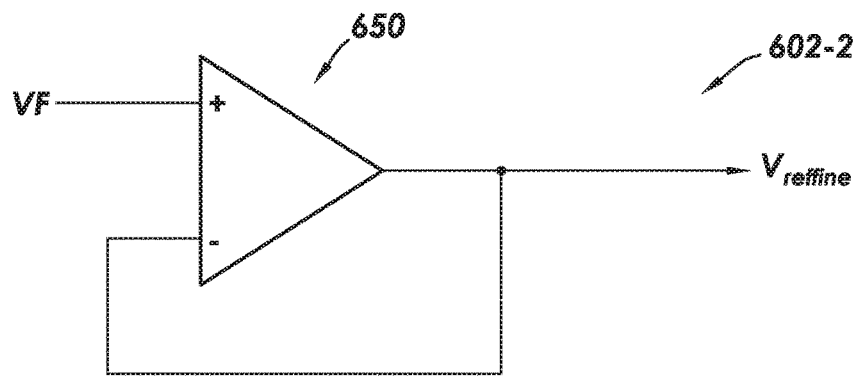
Figure 6C:
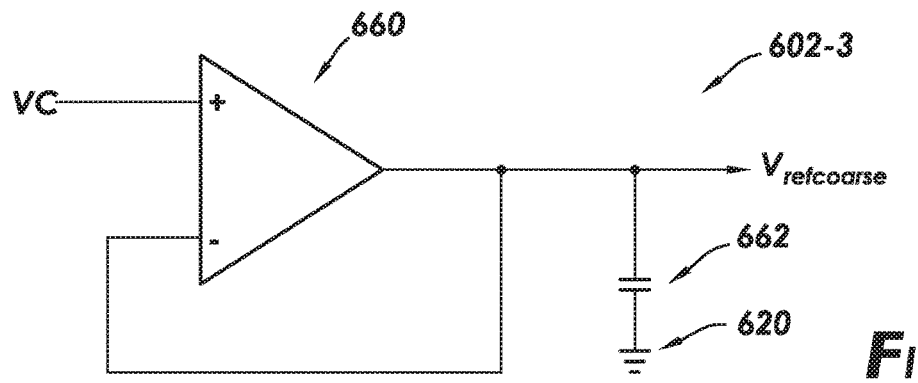

FIGS. 6A-6C show portions of illustrative reference signal generation circuitry (sometimes referred to herein as a reference buffer or a reference driver) for generating two reference signals using a base reference signal. As shown in FIG. 6A, portion 602-1 of reference signal generation circuitry 602 may receive an initial voltage VI. Based on the initial voltage VI, portions 602-2 and 60-3 of reference signal generation circuitry 602 may generate voltages Vreffine and Vrefcoarse, respectively (in FIGS. 6B and 6C).

Referring back to FIG. 6A, initial voltage VI may be a band gap reference voltage. Amplifier circuitry 604 (sometimes referred to herein as amplifier 604) may have first (non-inverting) and second (inverting) input terminals and an output terminal. Amplifier circuitry 604 may be an operational transconductance amplifier, as an example. Amplifier circuitry 604 may receive voltage VI at its non-inverting input and may be coupled to transistors 606 and 608 at its output terminal.

Transistor 606, variable resistor 610, and resistor 614 may be coupled in series between voltage terminals 618 and 620. The node between variable resistor 610 and resistor 614 may be coupled to the inverting input terminal of amplifier circuitry 604 as a feedback path. Transistor 608, variable resistor 612, and resistor 616 may be coupled in series between voltage terminals 618 and 620. As examples, voltage terminal 618 may supply a power supply voltage Vs and voltage terminal 618 may be provided at a grounding voltage.

A node between transistor 606 and variable resistor 610 may be an intermediate node VF for generating voltage Vreffine. Referring to FIG. 6B, intermediate node VF may be coupled to a non-inverting input terminal of amplifier circuitry 650. Amplifier circuitry 650 may have an inverting input terminal coupled to its output terminal in a feedback path. The output terminal of amplifier circuitry 650 may provide voltage Vreffine, which may be supplied to DAC circuitry, ADC circuitry, etc. (e.g., to the circuitry in FIGS. 3 and 4). Voltage Vreffine may be generated with a high bandwidth amplifier to supply fast settling.

A node between transistor 608 and variable resistor 612 may be an intermediate node VC for generating voltage Vrefcoarse. Referring to FIG. 6C, intermediate node VC may be coupled to a non-inverting input terminal of amplifier circuitry 660. Amplifier circuitry 660 may have an inverting input terminal coupled to its output terminal in a feedback path. The output terminal of amplifier circuitry 660 may be coupled to capacitor 662. The output terminal of amplifier circuitry 660 may generate voltage Vrefcoarse, which may be supplied to DAC circuitry, ADC circuitry, etc. (e.g., to the circuitry in FIGS. 3 and 4). As an example, voltage Vrefcoarse may be supplied (e.g., generated) with decoupling capacitance of 1 uF-4 uF with internal on-chip LDO (low-dropout regulator). As another example, voltage Vrefcoarse may be generated with a unity gain buffer for every (pixel) column without additional pad for decoupling capacitance. Voltage Vrefcoarse may be adjusted close to voltage Vreffine with trim. Voltages Vreffine and Vrefcoarse may be trimmed to match a desired reference voltage (e.g., voltage VI).

The systems and methods described herein use a coarse reference (voltage) to charge the DAC capacitor bottom plate to the coarse reference for a high slew rate and use a fine reference (voltage) to charge the DAC capacitor bottom plate for accurate settling. In fact, the coarse reference is trimmed to match closely to the fine reference such that the same coarse reference may be used as an analogous fine reference voltage in the LSB bank for faster conversion. In other words, the same coarse reference to charge the DAC capacitor bottom plate. In other words, the slew may be provided with the coarse reference and the high bandwidth may be supported with the fine reference. If desired, the same coarse reference may be used as a reference for the LSB bank of a split SAR ADC, since the reference accuracy requirements of the LSB bank can be relaxed to m (number of least significant bits)+1 bit accuracy.

The foregoing is merely illustrative of the principles of this invention and various modifications can be made by those skilled in the art. The foregoing embodiments may be implemented individually or in any combination.

What is claimed is:

1. Digital-to-analog conversion circuitry that receives an input signal, the digital-to-analog conversion circuitry comprising:
    a first plurality of capacitors associated with a first capacitor bank, wherein each capacitor in the first plurality of capacitors is configured to sample the input signal at a first terminal and to receive a selected one of a coarse reference voltage, a fine reference voltage, and an additional reference voltage at a second terminal, and wherein the first terminal of a given capacitor in the first plurality of capacitors is configured to receive an input voltage of the input signal using a sampling switch, and the second terminal of the given capacitor in the first plurality of capacitors is configured to selectively receive the coarse reference voltage using first and second switches and to selectively receive the fine reference voltage using the first switch and a third switch; and
    a second plurality of capacitors associated with a second capacitor bank, wherein each capacitor in the second plurality of capacitors is configured to sample the input signal at a first terminal and to receive a selected one of the coarse reference voltage and the additional reference voltage at a second terminal.

2. The digital-to-analog conversion circuitry defined in claim 1, wherein the additional reference voltage is a ground voltage.

3. The digital-to-analog conversion circuitry defined in claim 1, wherein the coarse reference voltage and the fine reference voltage are voltages larger than a ground voltage.

4. The digital-to-analog conversion circuitry defined in claim 1, wherein the coarse reference voltage and the fine reference voltage are generated based on a same initial reference voltage.

5. The digital-to-analog conversion circuitry defined in claim 1, wherein the second terminal of the given capacitor in the first plurality of capacitors is configured to receive the additional reference voltage using a fourth switch.

6. The digital-to-analog conversion circuitry defined in claim 5, wherein the second terminal of a given capacitor in the second plurality of capacitors is configured to receive the coarse reference voltage using a fifth switch and the second terminal of the given capacitor in the second plurality of capacitors is configured to receive the additional reference voltage using a sixth switch.

7. The digital-to-analog conversion circuitry defined in claim 1, further comprising:
  an additional capacitor having first and second terminals, wherein the first terminal of the additional capacitor is coupled to the first capacitor bank, and the second terminal of the additional capacitor is coupled to the second capacitor bank.

8. The digital-to-analog conversion circuitry defined in claim 7, wherein the sampling switch is coupled to the first terminal of the additional capacitor, and the first terminal of the additional capacitor is configured to provide an output voltage for the digital-to-analog conversion circuitry.

* * * * *